United States Patent
Kim et al.

(12) 
(10) Patent No.: US 10,886,242 B2
(45) Date of Patent: Jan. 5, 2021

(54) ANTENNA MODULE

(71) Applicant: SAMSUNG ELECTRO-MECHANICS CO., LTD., Suwon-si (KR)

(72) Inventors: Doo Il Kim, Suwon-si (KR); Won Wook So, Suwon-si (KR); Young Sik Hur, Suwon-si (KR); Jung Chul Gong, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/430,959

(22) Filed: Jun. 4, 2019

(65) Prior Publication Data

US 2020/0321293 A1  Oct. 8, 2020

(30) Foreign Application Priority Data

Apr. 4, 2019 (KR) .................. 10-2019-0039437

(51) Int. Cl.
*H01L 21/48* (2006.01)
*H01L 21/56* (2006.01)
(Continued)

(52) U.S. Cl.
CPC .......... *H01L 23/66* (2013.01); *H01L 21/4853* (2013.01); *H01L 21/56* (2013.01);
(Continued)

(58) Field of Classification Search
CPC . H01L 23/66; H01L 23/3135; H01L 23/3185; H01L 23/49816; H01L 23/5386; H01L 23/5389; H01L 21/4853; H01L 21/56; H01L 24/05; H01L 24/16; H01L 24/17; H01L 25/0657; H01L 2224/04105; H01L 2224/12105; H01L 2224/16225;
(Continued)

(56) References Cited

U.S. PATENT DOCUMENTS

| | | | |
|---|---|---|---|
| 2016/0240492 | A1 | 8/2016 | Wolter et al. |
| 2017/0062360 | A1 | 3/2017 | Chang et al. |

(Continued)

FOREIGN PATENT DOCUMENTS

| | | |
|---|---|---|
| KR | 10-2018-0052062 A | 5/2018 |
| KR | 10-1939046 B1 | 1/2019 |

*Primary Examiner* — Tong-Ho Kim
(74) *Attorney, Agent, or Firm* — Morgan, Lewis & Bockius LLP

(57) ABSTRACT

An antenna module includes an antenna substrate, a first semiconductor package, disposed on the antenna substrate, including a first connection member including one or more first redistribution layers, electrically connected to the antenna substrate, and a first semiconductor chip disposed on the first connection member, and a second semiconductor package, disposed on the antenna substrate to be spaced apart from the first semiconductor package, including a second connection member including one or more second redistribution layers, electrically connected to the antenna substrate, and a second semiconductor chip disposed on the second connection member. The first semiconductor chip and the second semiconductor chip are different types of semiconductor chips.

14 Claims, 14 Drawing Sheets

(51) Int. Cl.
  *H01L 23/31* (2006.01)
  *H01L 23/498* (2006.01)
  *H01L 23/538* (2006.01)
  *H01L 23/66* (2006.01)
  *H01L 23/00* (2006.01)
  *H01L 25/065* (2006.01)
  *H01Q 1/38* (2006.01)
  *H01Q 1/52* (2006.01)

(52) U.S. Cl.
  CPC ...... *H01L 23/3135* (2013.01); *H01L 23/3185* (2013.01); *H01L 23/49816* (2013.01); *H01L 23/5386* (2013.01); *H01L 23/5389* (2013.01); *H01L 24/05* (2013.01); *H01L 24/16* (2013.01); *H01L 24/17* (2013.01); *H01L 25/0657* (2013.01); *H01Q 1/38* (2013.01); *H01Q 1/526* (2013.01); *H01L 2224/04105* (2013.01); *H01L 2224/12105* (2013.01); *H01L 2224/16225* (2013.01); *H01L 2225/06582* (2013.01); *H01L 2924/15311* (2013.01)

(58) Field of Classification Search
  CPC ............ H01L 2225/06582; H01L 2924/15311; H01Q 1/38; H01Q 1/526
  USPC .......................................................... 257/678
  See application file for complete search history.

(56) References Cited

U.S. PATENT DOCUMENTS

2018/0130761 A1  5/2018  Kim et al.
2020/0135654 A1* 4/2020  Lee ........................ H01L 24/19

* cited by examiner

ANTENNA MODULE

CROSS-REFERENCE TO RELATED APPLICATION(S)

This application claims the benefit of priority to Korean Patent Application No. 10-2019-0039437 filed on Apr. 4, 2019 in the Korean Intellectual Property Office, the entire disclosure of which is incorporated herein by reference.

TECHNICAL FIELD

The present disclosure relates to an antenna module.

BACKGROUND

Recently, millimeter wave (mmWave) communications, including fifth generation (5G) communications, have been researched, and research into the commercialization of an antenna module, able to smoothly implement mmWave communications, has been performed.

Conventionally, an antenna module, providing a mmWave communications environment, uses a structure in which an integrated circuit (IC) and an antenna are disposed on a board and are connected to each other by a coaxial cable to provide a high level of antennal performance (for example, a transmission and reception rate, a gain, directivity, and the like) at a high frequency.

However, such a structure may cause a shortage of an antenna layout space, a restriction of the degree of freedom of an antenna shape, an increase in interference between the antenna and the IC, and an increase in the size/cost of the antenna module.

SUMMARY

An aspect of the present disclosure is to provide an antenna module in which a signal path between an antenna and a semiconductor chip is shortened and a degree of freedom in terms of the shape of the antenna is high.

According to an aspect of the present disclosure, a first semiconductor package, including a first semiconductor chip and a second semiconductor package, including a second semiconductor chip, are mounted on an antenna substrate to be spaced apart from each other.

For example, an antenna module includes an antenna substrate including a core layer, one or more upper wiring layers disposed on a top surface of the core layer, and one or more lower wiring layers disposed on a bottom surface of the core layer, a first semiconductor package, disposed on the antenna substrate, including a first connection member including one or more first redistribution layers, electrically connected to the antenna substrate, and a first semiconductor chip disposed on the first connection member, and a second semiconductor package, disposed on the antenna substrate to be spaced apart from the first semiconductor package, including a second connection member including one or more second redistribution layers, electrically connected to the antenna substrate, and a second semiconductor chip disposed on the second connection member. The first semiconductor chip and the second semiconductor chip are different types of semiconductor chips.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Electronic Device

Figure 1:
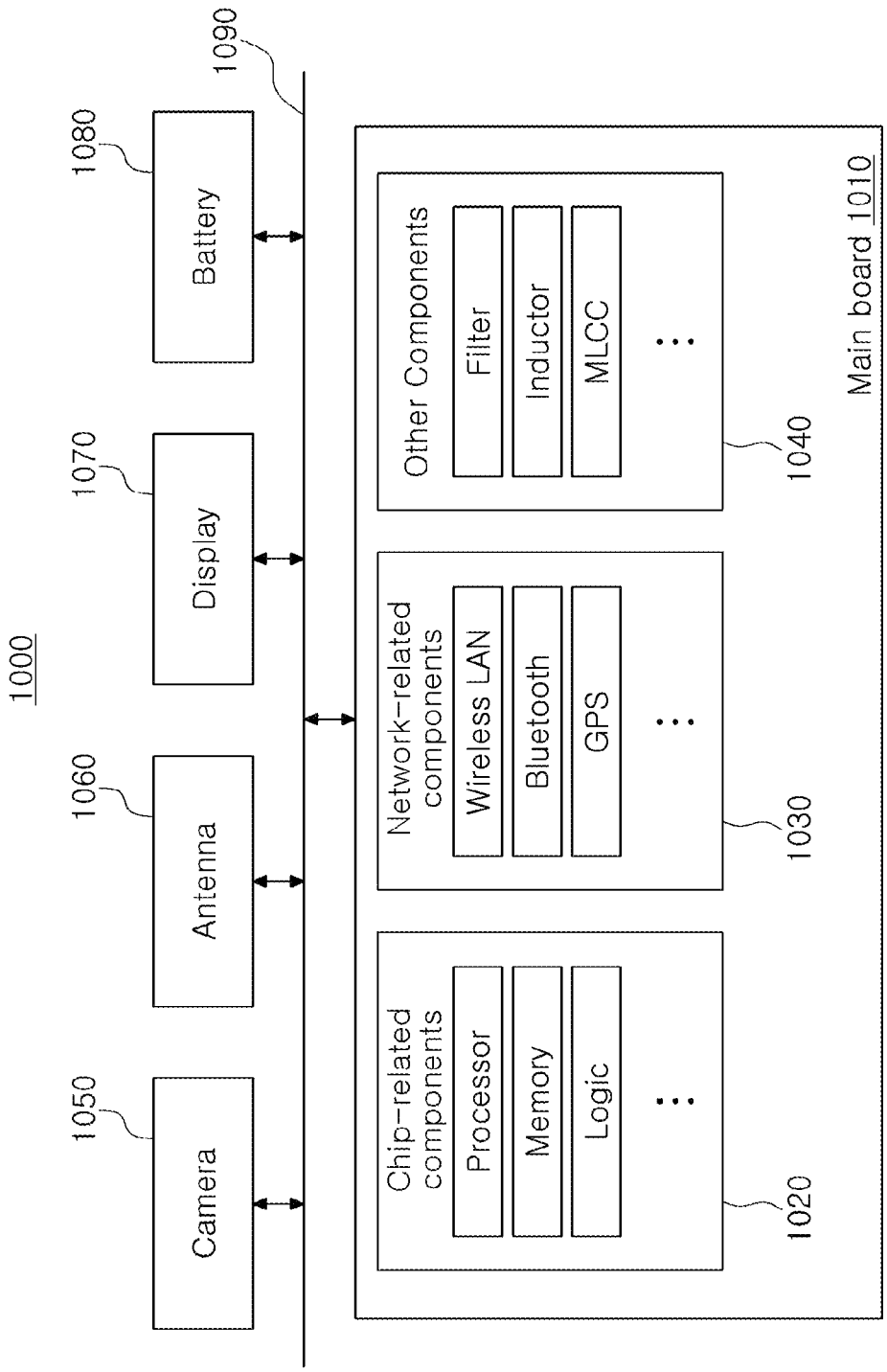
FIG. 1 is a block diagram schematically illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
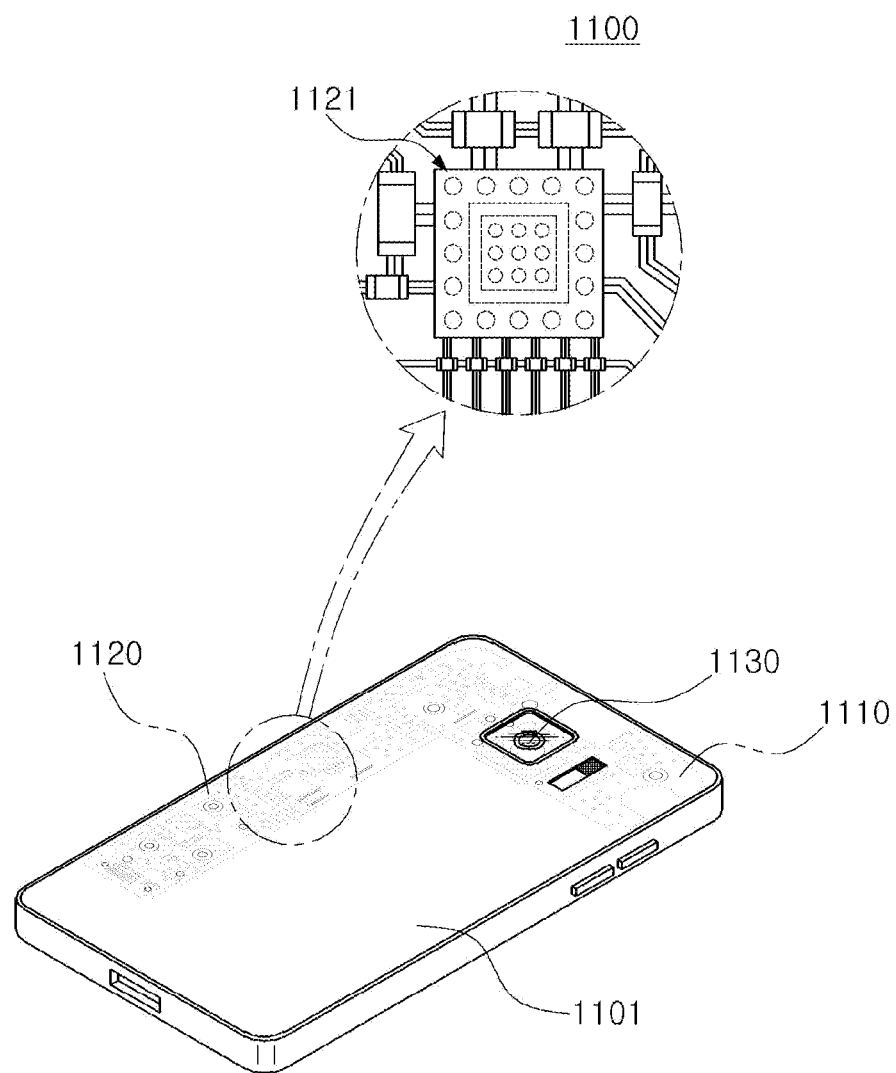
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3A:
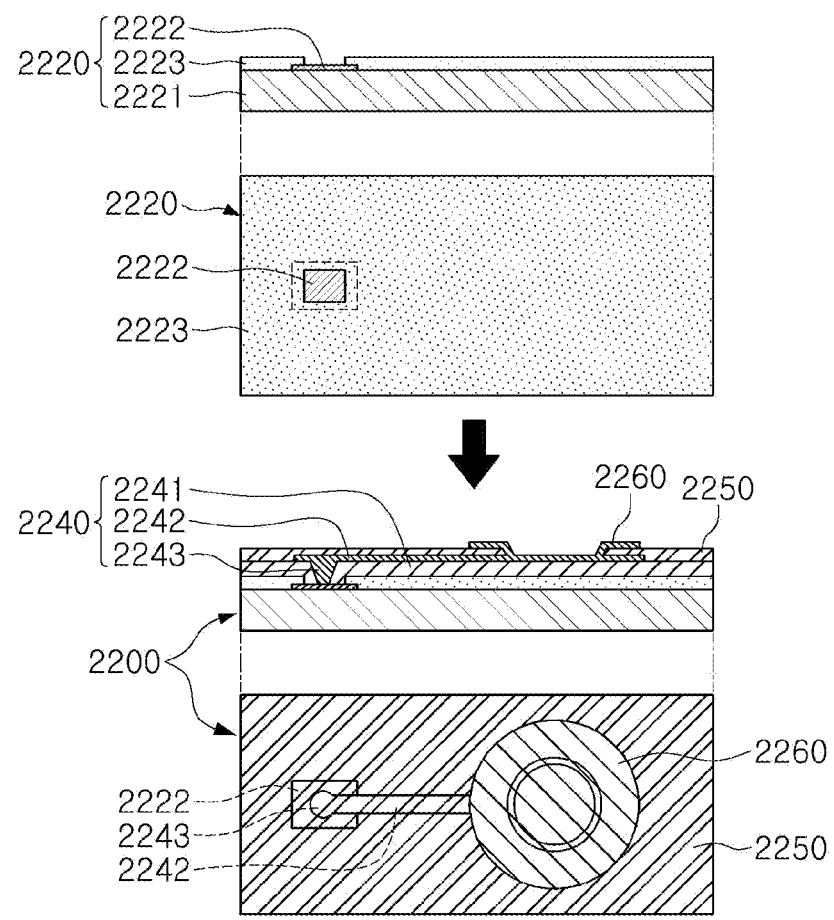
FIGS. 3A and 3B are schematic cross-sectional views illustrating states of a fan-in semiconductor package before and after being packaged.
Figure 3B:
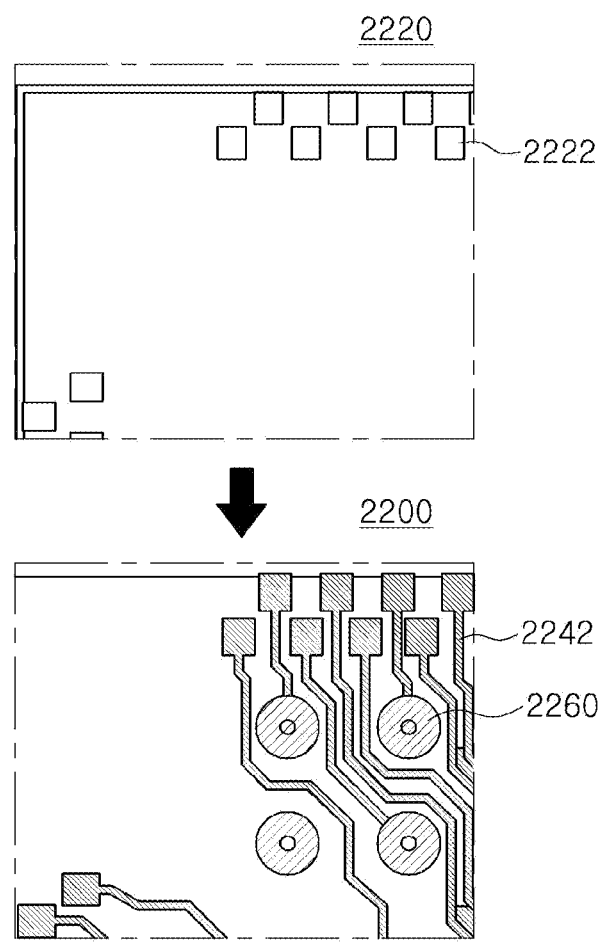

FIGS. 3A and 3B are schematic cross-sectional views illustrating states of a fan-in semiconductor package before and after being packaged.

Figure 4:
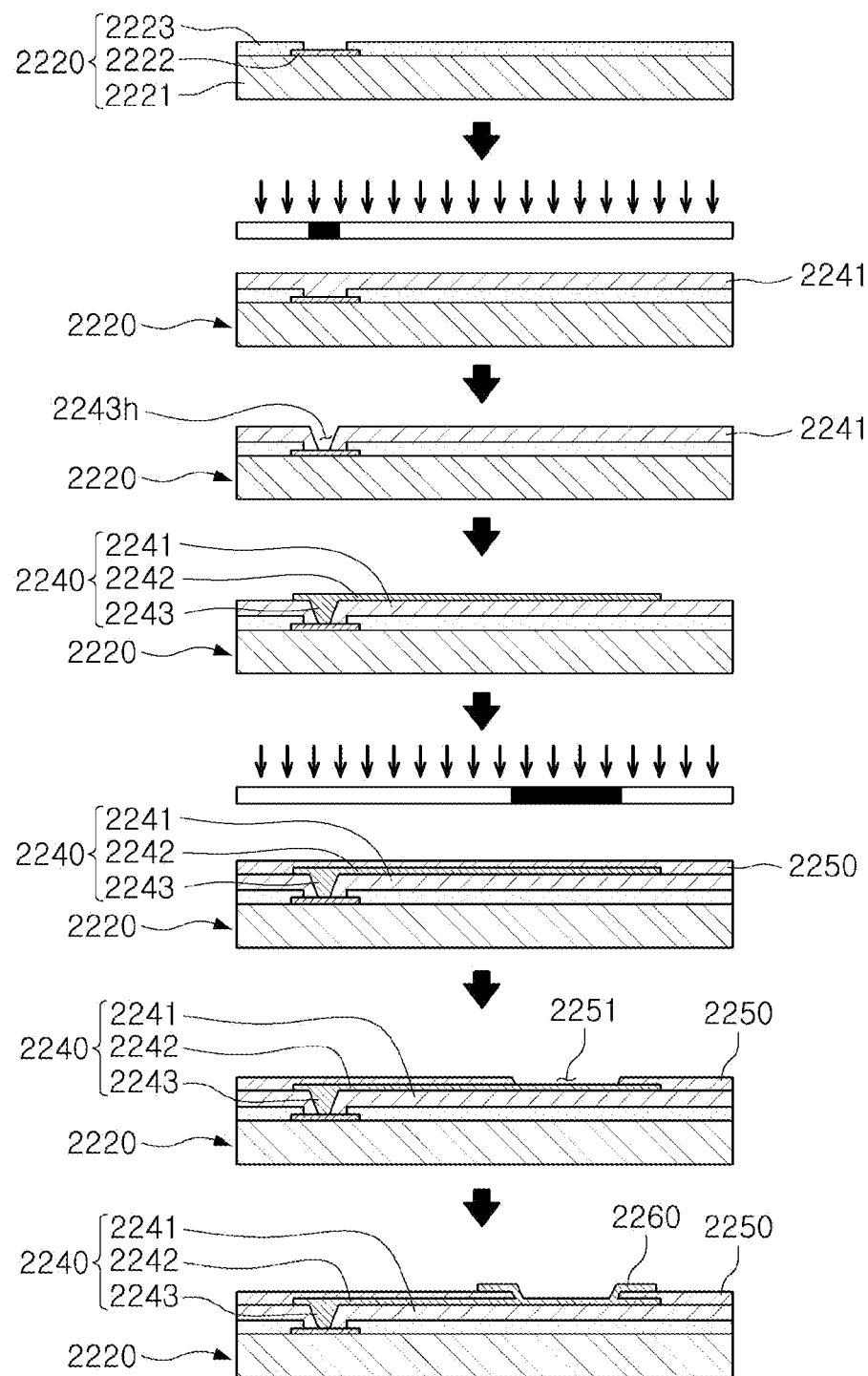
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
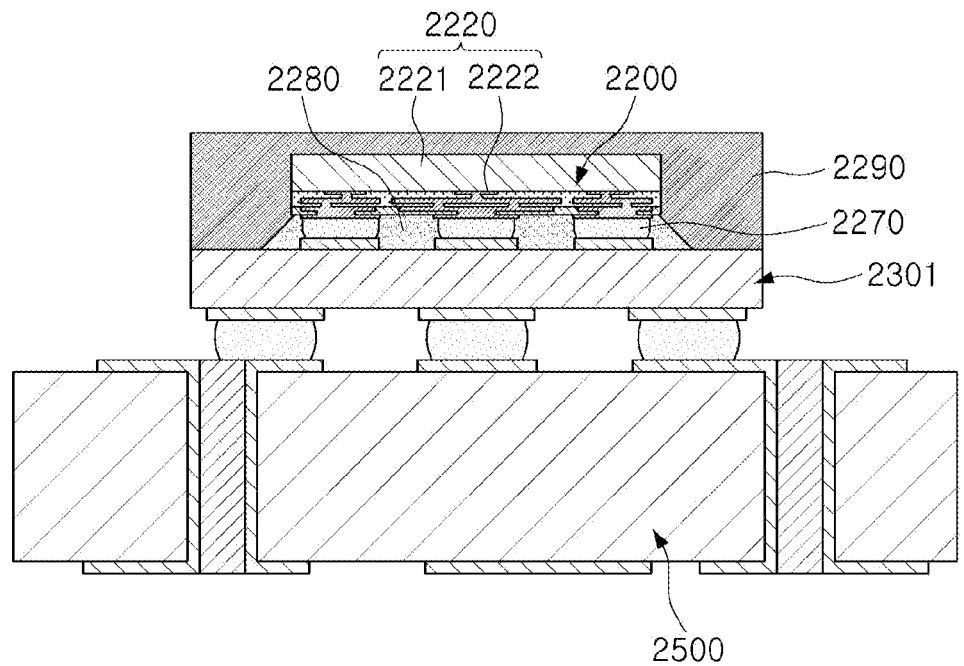
FIG. 5 is a schematic cross-sectional view illustrating a case in which a fan-in semiconductor package is mounted on a printed circuit board and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
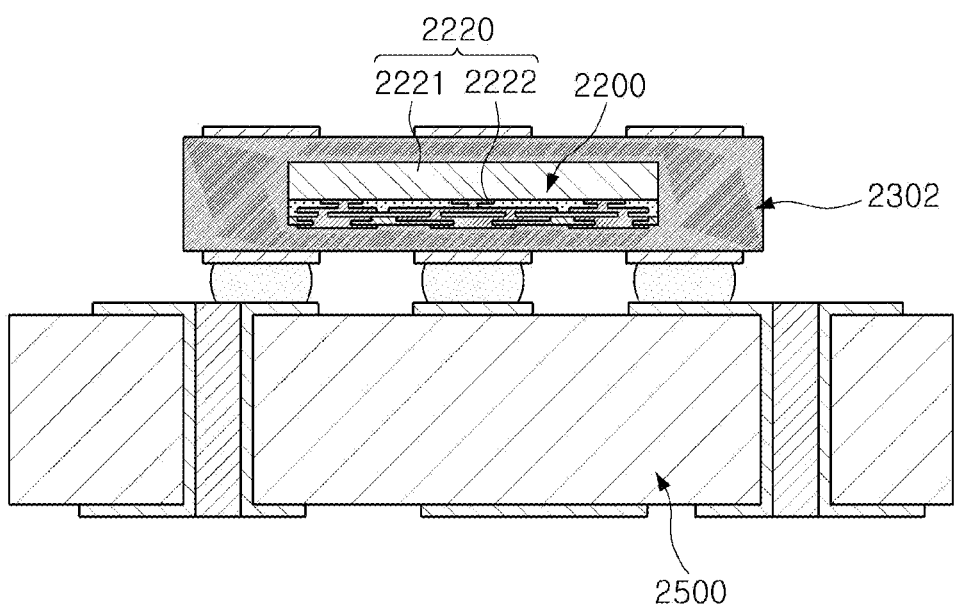
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
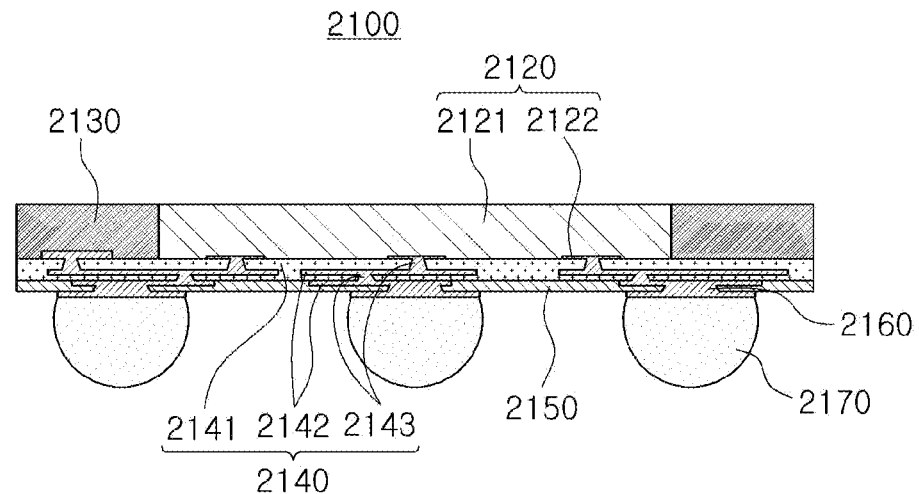
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
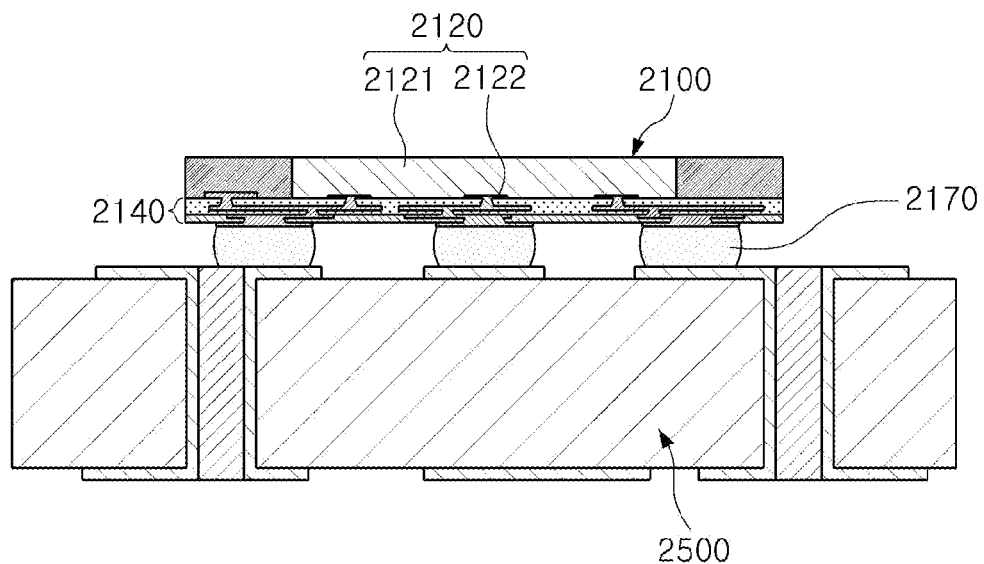
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

Antenna Module

Figure 9:
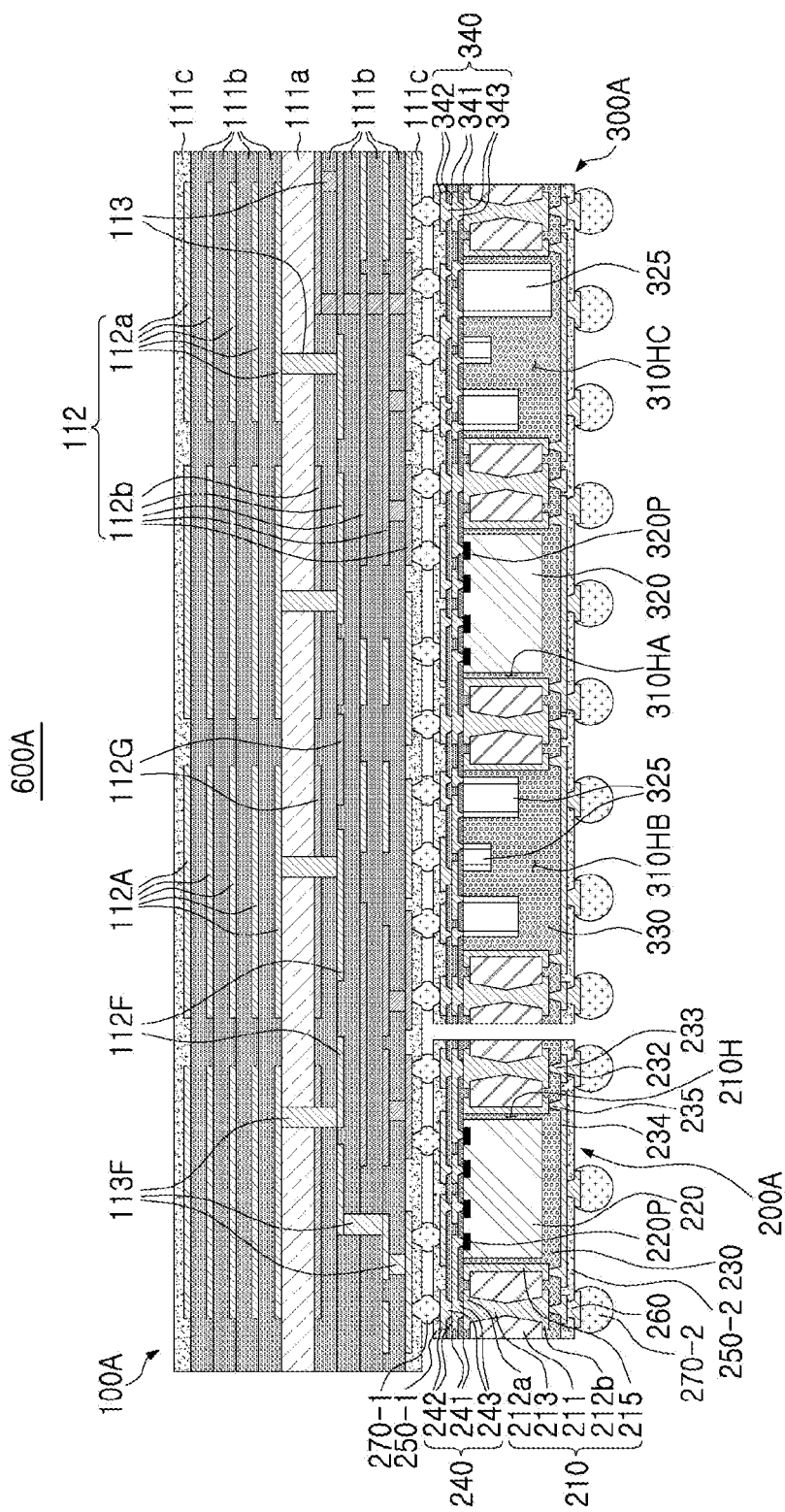
FIG. 9 is a schematic cross-sectional view illustrating an example of an antenna module.
Figure 10A:
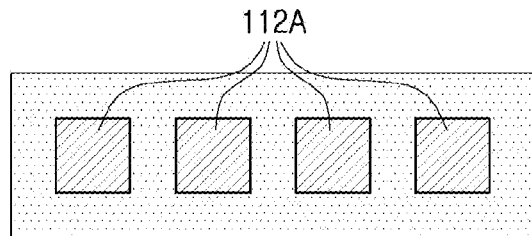
FIGS. 10A to 10E are plan views illustrating various types of an antenna substrate.
Figure 10B:
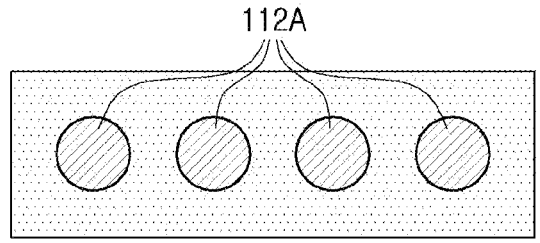
Figure 10C:
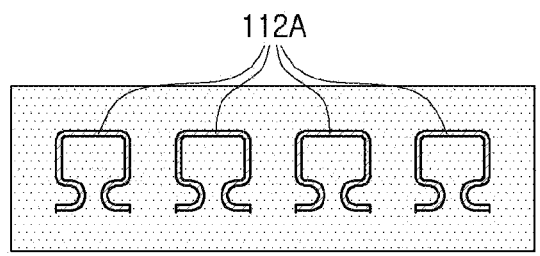
Figure 10D:
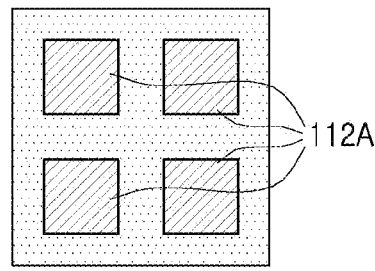
Figure 10E:
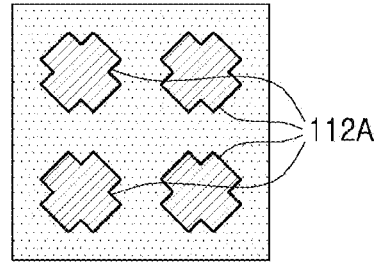

FIG. 9 is a schematic cross-sectional view illustrating an example of an antenna module, and FIG. 10 is a plan view illustrating various types of an antenna substrate.

Referring to FIG. 9, an antenna module 600A according to an example embodiment includes an antenna substrate 100A including a core layer 111a, one or more upper wiring layers 112a disposed on a top surface of the core layer 111a, and one or more lower wiring layers 112b disposed on a bottom surface of the core layer 111a, a first semiconductor package 200A, disposed on the antenna substrate 100A, including a first connection member 240 including one or more first redistribution layers 242, electrically connected to the antenna substrate 100A, and a first semiconductor chip 220 disposed on the first connection member 240, and a second semiconductor package 300A, disposed on the antenna substrate 100A to be spaced apart from the first semiconductor package 200A, including a second connection member 340 including one or more second redistribution layers 342, electrically connected to the antenna substrate 100A, and a second semiconductor chip 320 disposed on the second connection member 340. The first semiconductor chip 220 and the second semiconductor chip 320 are different types of semiconductor chips, and may be electrically connected to each other through the lower wiring layer 112b.

When an antenna module, configured to implement millimeter wave (mmWave) communications including fifth generation (5G) communications, is applied to a mobile device such as a smartphone, a shape of an antenna, determining a design of an antenna module, and a high degree of freedom for variously designing the shape of the antenna are required to secure a degree of freedom in disposition of the antenna module in a set.

Accordingly, in the antenna module 600A, the first and second semiconductor packages 200A and 300A, packaging various types of semiconductor chips 220 and 320 and a passive component 325 for each group, are mounted using surface mount technology (SMT). For example, since a package, mounted on the antenna substrate 100A, may be divided to be appropriately disposed depending on a shape the antenna substrate 100A, a degree of freedom in the shape of antennal substrate 100A may be secured. As a result, a degree of freedom in disposition of the antenna module may be secured in a set.

The antenna module 600A may include electrical connection metals 270-1 and 270-2 for forming an electrical connection to an external substrate, for example, a mainboard or the like. For example, the first semiconductor package 200A and the second semiconductor package 300A may include a plurality of first electrical connection metals 270-1 and a second electrical connection metal 270-2. The plurality of first electrical connection metals 270-1 have a first surface, facing a bottom surface of the antenna substrate 100A, and a second surface opposing the first surface, are respectively disposed on the first surface of the first semiconductor package 200A and the second semiconductor package 300A, and are electrically connected to the first redistribution layer 242, the second redistribution layer 342, and the lower wiring layer 112b of the antenna substrate 100A. The second electrical connection metal 270-2 is disposed on the respective first and second semiconductor packages 200A and 300A and is electrically connected to a backside wiring layer 232 and a backside metal layer 234.

Hereinafter, components of the antenna module 600A will be described in detail with reference to accompanying drawings.

Antenna Substrate

The antenna substrate 100A is a region, in which a mmWave/5G antenna may be implemented, and includes an antenna pattern 112A and a ground pattern 112G. More specifically, the antenna substrate 100A includes a core layer 111a, an insulating layer 111b, a passivation layer 111c, a wiring layer 112, and a connection via layer 113. The antenna substrate 100A may have a shape in which insulating layers 111b are built up to both sides on the basis of the core layer 111a. In this case, upper wiring layers 112a and lower wiring layers 112b, respectively disposed above and below the core layer 111a, may be disposed on the core layer 111a and the respective insulating layers 111b. The wiring layers 112 may be electrically connected to each other through the connection via layer 113 penetrating through the core layer 111a and the respective insulating layers 111b.

The antenna pattern 112A of the wiring layer 112 may be disposed on a top surface of the core layer 111a, and a ground pattern 112G of the wiring layer 112 may be disposed on a bottom surface of the core layer 111a. Antenna patterns 112A may be disposed on the insulating layers 111b built up to an upper side of the core layer 111a, respectively. The antenna patterns 112A, respectively disposed on the insulating layers 111b built up to the upper side of the core layer 111a, may be disposed directly above and below each other to be coupled to each other. For example, capacitance may be formed. However, the disposition of the antenna patterns 112A may vary depending on a type of antenna. As necessary, the insulating layers 111b may only be built up to a lower side of the core layer 111a. In this case, antenna patterns 1112A, disposed on the insulating layers 111b built up to the upper side of the core layer 111a, may be omitted.

The antenna patterns 112A, disposed on the top surface of the core layer 111a, may be electrically and/or signally connected to at least one of the semiconductor chips 221 and 222 through a feeding pattern 112F of the wiring layer 112 and a feeding pattern 113F of the connection via layer 113. The ground pattern 112G may be electrically connected to at least one of the semiconductor chips 221 and 222 as well as an electronic component 300 through another ground pattern of the wiring layer 112 and a connection via for grounding of the connection via layer 113. The core layer 111a is disposed between the antenna pattern 112A and the ground pattern 112G, such that a distance between an antenna and a ground surface may be stably secured in a single complex module irrespective of change in an external environment to maintain radiation characteristics of the antenna. In addition, the antenna substrate 100A may be miniaturized by appropriately using a dielectric constant Dk of the core layer 111a to reduce a size of the antenna module 500A. Thus, an entire module structure may be reduced to improve spatial efficiency and to achieve cost reductions.

A material of the core layer 111a may be an insulating material. The insulating material may be a thermosetting resin such as an epoxy resin, a thermoplastic resin such as a polyimide resin, a resin in which the thermosetting resin or the thermoplastic resin is mixed with a reinforcing material such as an inorganic filler or is impregnated together with an inorganic filler in a core material such as a glass fiber (or a glass cloth or a glass fabric), for example, prepreg. However, the material of the core layer 111a is not limited to a resin material, and may be a glass plate or a ceramic plate. The core layer 111a may have a thickness greater than a thickness of each of the insulating layers 111b to secure a sufficient distance between the antenna pattern 112A and the ground pattern 112G.

A material of the insulating layer 111b may be an insulating material. The insulating material may be a thermosetting resin such as an epoxy resin, a thermoplastic resin such as a polyimide resin, a resin in which the thermosetting resin or the thermoplastic resin is mixed with a reinforcing material such as an inorganic filler, for example, Ajinomoto Build-up Film (ABF). However, the insulating material is not limited thereto, and may be a photoimageable dielectric (PID). Even if materials of the respective insulating layers 111b are the same, boundaries therebetween may be apparent.

Passivation layers 111c may be disposed on outermost layers of the antenna substrate 100A to protect components in the antenna substrate 100A. Each of the passivation layers 111c may also include an insulating material. The insulating material may be, for example, ABF or the like, but is not limited thereto. An opening, not illustrated, may be formed in the upper passivation layer 111c in such a manner that at least a portion of the wiring layer 112 is exposed to electrically connect the wiring layer 112 to the electronic component 300 and/or a connector 410.

The wiring layer 112 includes the antenna pattern 112A, substantially implementing a mmWave/5G antenna or the like, and may include other ground patterns 112G, the feeding patterns 112F, and the like. The antenna pattern 112A may be a dipole antenna, a patch antenna, or the like depending a disposition and a shape of the antenna pattern 112A. The ground pattern 112G may have a shape of a ground plane. A periphery of the antenna pattern 112A may be surrounded by a ground pattern, not illustrated, disposed on the same level, but is not limited thereto. The wiring layer 112 may further include another signal pattern, a power pattern, a resistance pattern, and the like. The wiring layer 112 may be formed of a conductive material such as copper (Cu), aluminum (Al), silver (Ag), tin (Sn), gold (Au), nickel (Ni), lead (Pb), titanium (Ti), or alloys thereof, but the conductive material is not limited thereto.

The connection via layer 113 electrically connects wiring layers 112, disposed on different layers, to each other to provide an electrical path in the antenna substrate 100A. The connection via layer 113 includes a feed via 113F, and may include another connection via for grounding and the like. The connection via layer 113 may further include another connection via for signal, a connection via for power, and the like. The feed via 113F may be electrically and/or signally connected to the antenna pattern 112A. Some connection vias for grounding, not illustrated, may densely surround a periphery of the feed via 113F. The connection via layer 113 may be formed of a conductive material such as copper (Cu), aluminum (Al), silver (Ag), tin (Sn), gold (Au), nickel (Ni), lead (Pb), titanium (Ti), or alloys thereof. A connection via of each of the connection via layers 113 may be filled with a conductive material. Alternatively, a conductive material is formed along a wall surface of a via, unlike the drawing. In addition, the connection via layer 113 may have all known vertical cross-sectional shapes such as a cylindrical shape, an hourglass shape, a tapered shape, and the like.

First Semiconductor Package and Second Semiconductor Package

The first semiconductor package 200A and the second semiconductor package 300A are configured to electrically connect the first semiconductor chip 220 and the second semiconductor chip 320, embedded therein, to the antenna substrate 100A, respectively. However, the configurations of the first semiconductor package 200A and the second semiconductor package 300A are not limited to those described later. In the case of components of the second semiconductor package 300A duplicated with components of the first semiconductor package 200A, reference numerals thereof are omitted in the drawings.

A frame 210 includes wiring layers 212a and 212b, and may decrease the number of layers of the connection members 240 and 340. The frame 210 may further improve rigidity of the semiconductor packages 200A and 300A depending on a detailed material of the insulating layer 211, and may serve to secure thickness uniformity of encapsulants 230 and 330. Upper and lower electrical paths may be provided in the semiconductor packages 200A and 300A by wiring layers 212a and 212b and a connection via 213 of the frame 210. The frame 210 has through-holes 210H and 310H. In the through-hole 210H, the semiconductor chips 220 and 320 are disposed to be spaced apart from the frame 210 by predetermined distances, respectively. In the case of the second semiconductor package 300A, unlike the drawing, in a through-hole 310HA, the second semiconductor chip 320 and the passive component 325 may be disposed side by side to be spaced apart from the frame 210 by predetermined distances, respectively. Peripheries of side surfaces of the semiconductor chips 220 and 320 and the passive component 325 may be surrounded by the frame 210. However, such a form is only an example and may be variously modified to have other forms, and the frame 210 may perform another function depending on such a form.

In the case of the second semiconductor package 300A, the frame 210 may have one or more through-holes. For example, the frame 210 may have first to third through-holes 310HA, 310HB, and 310HC. In each of the first to third through-holes 310HA, 310HB, and 310HC, the second semiconductor chip 320 and the passive component 325 may be disposed side by side to be spaced apart from the frame 210 by a predetermined distance. Peripheries of side surfaces of the second semiconductor chip 320 and the passive component 325 may be surrounded by the frame 210. However, such a form is only an example and may be variously modified to have other forms, and the frame 210 may perform another function depending on such a form.

The frame 210 includes an insulating layer 211, a first wiring layer 212a disposed on a top surface of the insulating layer 211, a second wiring layer 212b disposed on a bottom surfaced of the insulating layer 211, and a connection via 213 penetrating through the insulating layer 211 and electrically connecting the first and second wiring layers 213a and 212b to each other. Each of the first and second wiring layers 212a and 212b of the frame 210 may have a thickness greater than a thickness of the redistribution layer 242 of the connection member 240. The frame 210 may have a thickness similar to or greater than a thickness of each of the semiconductor chips 220 and 320. Thus, the first and second wiring layers 212a and 212b may be formed to have greater thicknesses, matching scales thereof, through a substrate process. On the other hand, the redistribution layer 242 of the connection member 240 may have formed to have a smaller size through a semiconductor process to be thinned.

A material of the insulating layer 211 is not limited and may be, for example, an insulating material. The insulating material may be a thermosetting resin such as an epoxy resin, a thermoplastic resin such as a polyimide resin, a resin in which the thermosetting resin or the thermoplastic resin is mixed with a reinforcing material such as an inorganic filler or is impregnated together with an inorganic filler in a core material such as a glass fiber (or a glass cloth or a glass fabric), for example, prepreg, but is not limited thereto. For example, the material of the insulating layer 211 may be a glass or ceramic-based insulating material according to required material characteristics.

The wiring layers 212a and 212b may server to redistribute connection pads 220P and 320P of the semiconductor chips 220 and 320. In addition, the wiring layers 212a and 212b may be used as connection patterns when the packages 200A and 300A are electrically connected to overlying and underlying other components. The wiring layers 212a and 212b may be formed of a conductive material such as copper (Cu), aluminum (Al), silver (Ag), tin (Sn), gold (Au), nickel (Ni), lead (Pb), titanium (Ti), or alloys thereof. The wiring layers 212a and 212b may include ground (GND) patterns, power (PWR) patterns, signal (S) patterns, and the like. The signal (S) patterns may include various signals except for the ground (GND) patterns, the power (PWR) patterns, and the like, such as data signals, and the like. In addition, the wiring layers 212a and 212b may include via pads and the like.

The connection via 213 may electrically connect the wiring layers 212a and 212b, disposed on different layers, to each other. Thus, an electrical path is formed in the frame 210.

The connection via 213 may also be formed of a conductive material such as copper (Cu), aluminum (Al), silver (Ag), tin (Sn), gold (Au), nickel (Ni), lead (Pb), titanium (Ti), or alloys thereof. The connection via 213 may be filled with a conductive material. Alternatively, a conductive material may be formed along a wall surface of a via hole, unlike the drawing. In addition, the connection via 213 may have all known vertical cross-sectional shapes such as an hourglass shape, a cylindrical shape, and the like. The connection via 213 may also include a connection via for signal, a connection via for grounding, or the like.

A metal layer 215 may be further disposed on respective wall surfaces of the through-holes 210H, 310HA, 310HB, and 310HC of the frame 210, as necessary. The metal layer 215 may be formed on the respective entire wall surfaces of the through-holes 210H, 310HA, 310HB, and 310HC to surround the semiconductor chips 220 and 320 and the passive component 325. As a result, radiation characteristics may be improved and an electromagnetic interference (EMI) shielding effect may be achieved. The metal layer 215 may extend to a top surface and a bottom surface of the frame 210, for example, a top surface and a bottom surface of the insulating layer 211. The metal layer 215 may be formed of a conductive material such as copper (Cu), aluminum (Al), silver (Ag), tin (Sn), gold (Au), nickel (Ni), lead (Pb), titanium (Ti), or alloys thereof. The metal layer 215 may be electrically connected to a ground pattern and/or a power pattern of the first wiring layer 212a and/or the second wiring layer 212b to be used as a ground plane.

Each of the semiconductor chips 220 and 320 may be a bare integrated circuit (IC) in which hundreds to millions of or more devices are integrated in a single chip. Each of the semiconductor chips 220 and 320 may include a body in which various circuits are formed. Connection pads 220P and 320P may be formed on active surfaces of the bodies, respectively. The body may be formed based on, for example, an active wafer. In this case, a base material may be silicon (Si), germanium (Ge), gallium arsenide (GaAs), or the like. The connection pads 220P and 320P may be provided to electrically connect the semiconductor chips 220 and 320 to other components, respectively. The connection pads 220P and 320P may be formed of a conductive material, in detail, aluminum (Al), but the conductive material is not limited thereto. The semiconductor chips 220 and 320 may have active surfaces, on which the connection pads 220P and 320P are disposed, and inactive surfaces opposing the active surfaces, respectively. Although not illustrated, a passivation layer, including an oxide layer and/or a nitride layer, may be formed on the active surface of each of the semiconductor chips 220 and 320. The oxide layer of the passive layer has an opening exposing at least a portion of each of the connection pads 220P and 320P. Each of the semiconductor chips 220 and 320 may be disposed in a face-up orientation to have a minimum signal path to the antenna substrate 100A.

The integrated circuit (IC) of the first semiconductor chip 220 may be, for example, a radio-frequency integrated circuit (RFIC), and the integrated circuit (IC) of the second semiconductor chip 320 may be, for example, a power management integrated circuit (PMIC).

The passive component 325 is disposed parallel to the second semiconductor chip 320 in the second semiconductor package 300A. The passive component 325 may be a known passive component such as a capacitor, an inductor, or the like. As an unlimited example, the passive component 325 may be a capacitor, in further detail, a multilayer ceramic capacitor (MLCC). The passive component 325 may be electrically connected to the respective connection pads 220P and 320P of the semiconductor chips 220 and 310 through the connection members 240 and 340. The number of passive components is not limited.

The encapsulant 230 may protect the semiconductor chips 221 and 222, the passive component 225, and the like, and may provide an insulating region. An encapsulation form of the encapsulant 230 is not limited as long as at least portions of the semiconductor chips 221 and 222 and the passive component 225 are covered with the encapsulant 230. For example, the encapsulant 230 may cover the bottom surface of the frame 210, a side surface and an inactive surface of each of the semiconductor chips 221 and 222, and a side surface and a bottom surface of the passive component 225. The encapsulant 230 may fill spaces in the through-holes 210HA, 210HB, and 210HC. A detailed material of the encapsulant 230 is not limited, and may be an insulating material such as ABF or the like. As necessary, the material of the encapsulant 230 may be a photoimageable encapsulant (PIE). As necessary, the encapsulant 230 may include a plurality of encapsulants such as a first encapsulant, encapsulating the passive component, a second encapsulant, encapsulating the first and second semiconductor chips 221 and 22, and the like.

The backside wiring layer 232 and the backside metal layer 234 may be disposed on bottom surfaces of the encapsulants 230 and 330. The backside wiring layer 232 may be connected to the second wiring layer 212b of the frame 210 through a backside connection via 233 penetrating through the encapsulants 230 and 330. The backside metal layer 234 may be connected to a metal layer 215 of the frame 210 through a backside metal via 235 penetrating through the encapsulants 230 and 330. The backside wiring layer 232 and the backside metal layer 234 may include a conductive material such as copper (Cu), aluminum (Al), silver (Ag), tin (Sn), gold (Au), nickel (Ni), lead (Pb), titanium (Ti), or alloys thereof. The backside wiring layer 232 may include a single pattern, a via pad for signal, and the like. The backside metal layer 234 may cover inactive surfaces of the semiconductor chips 220 and 230 and the passive component 325, and may be connected to the metal layer 215 through the backside metal via 235 to implement an improved radiation effect and an improved electromagnetic interference (EMI) shielding effect. The backside metal layer 234 may also be connected to a ground pattern and/or a power pattern of the wiring layers 212a and 212b of the frame 210 to be used as a ground.

The connection members 240 and 340 may redistribute the connection pads 220P and 320P of the semiconductor chips 220 and 320. Connection pads 220P and 320P of tens to hundreds of semiconductor chips 220 and 320, having various functions, may be redistributed through the connection members 240 and 340, respectively. The connection members 240 and 340 may electrically connect the connection pads 220P and 320P of the semiconductor chips 220 and 320 to the passive component 325. The connection members 240 and 340 may provide an electrical connection path to the antenna substrate 100A. The connection members 240 and 340 include insulating layers 241 and 341, redistribution layers 242 and 342, disposed on the insulating layers 241 and 341, and redistribution vias 243 and 343, connected to the redistribution layers 242 and 342, penetrating through the insulating layers 241 and 341. Each of the connection members 240 and 340 may include a single layer, or may be designed as a plurality of layers greater in number than those illustrated in the drawing.

A material of the insulating layers 241 and 341 may be an insulating material. The insulating material may be a photosensitive insulating material such as a PID resin, in addition to the above-mentioned insulating material. For example, the insulating layers 241 and 341 may be photosensitive insulating layers. When the insulating layers 241 and 341 have photosensitive properties, each of the insulating layers 241 and 341 may be formed to have a smaller thickness and a fine pitch of the redistribution vias 243 and 343 may be more easily achieved. Each of the insulting layers 241 and 341 may be a photosensitive insulating layer including an insulating resin and an inorganic filler. When the insulating layers 241 and 341 are formed as a multilayer structure, materials of the insulating layers 241 and 341 may be the same as each other and, as necessary, may be different from each other. When the insulating layers 241 and 341 are the multiple layers, the insulating layers 241 and 341 may be integrated with each other depending on a process, such that boundaries therebetween may not be apparent.

The redistribution layers 242 and 342 may serve to substantially redistribute the connection pads 220P and 320P. A material of each of the redistribution layers 242 and 342 may be a conductive material such as copper (Cu), aluminum (Al), silver (Ag), tin (Sn), gold (Au), nickel (Ni), lead (Pb), titanium (Ti), or alloys thereof. The redistribution layers 242 and 342 may perform various functions depending on designs of corresponding layers thereof. The redistribution layers 242 and 342 may include ground (GND) patterns, power (PWR) patterns, signal (S) patterns, and the like. The signal (S) patterns may include various signals except for the ground (GND) patterns, the power (PWR) patterns, and the like, such as data signals, and the like. In addition, the redistribution layers 242 and 342 may include various pad patterns such as via pads, connection terminal pads, and the like. The redistribution layers 242 and 342 may include feeding patterns.

The redistribution vias 243 and 343 electrically connects the redistribution layers 242 and 342, disposed on different layers, to each other to provide an electrical path in the package 200A. The redistribution vias 243 and 343 may be formed of a conductive material such as copper (Cu), aluminum (Al), silver (Ag), tin (Sn), gold (Au), nickel (Ni), lead (Pb), titanium (Ti), or alloys thereof. The connection vias 243 and 343 may be filled with a conductive material. Alternatively, a conductive material is formed along a wall surface of a via. In addition, the connection vias 243 and 343 may have a tapered shape in a direction opposite to the backside connection via 233 and the backside metal via 235. The redistribution via 243 may have a feed via.

A first passivation layer 250-1, having an opening exposing at least portions of the redistribution layers 242 and 342, may be disposed on the connection members 240 and 340. The first passivation layer 250-1 may protect the connection members 240 and 340 from external physical or chemical impact. The first passivation layer 250-1 may include an insulating resin and an inorganic filler, but may not include a glass fiber. For example, the first passivation layer 250-1 may be ABF, but is not limited thereto and may be PID, a solder resist, or the like.

A second passivation layer 250-2 may be disposed below the encapsulants 230 and 330 to cover at least a portion of the backside wiring layer 232 and/or the backside metal layer 234. The second passivation layer 250-2 may protect the backside wiring layer 232 and/or the backside metal layer 234 from external physical or chemical impact. The second passivation layer 250-2 may also include an insulating resin and an inorganic filler, and may not include a glass fiber. For example, the second passivation layer 250-2 may be ABF, but is not limited thereto and may be PID, a solder resist, or the like.

A plurality of electrical connection metals 270-1 and 270-2 may be disposed on the openings of the passivation layers 250-1 and 250-2 to be electrically connected to the exposed redistribution layers 242 and 342. The electrical connection metals 270-1 and 270-2 are configured to physically and/or electrically connect the packages 200A and 300A to the antenna substrate 100A. The electrical connection metals 270-1 and 270-2 may be formed of a low melting point metal, for example, tin (Sn) or a Sn-containing alloy, in further detail, a solder or the like. However, the above materials are merely exemplary materials, and a material of the electrical connection metals 270-1 and 270-2 is not limited thereto. Each of the electrical connection metals 270-1 and 270-2 may be a land, a ball, a pin, or the like. The electrical connection metals 270-1 and 270-2 may be formed as a multilayer structure or a single-layer structure. When the electrical connection metals 270-1 and 270-2 are formed as a multilayer structure, the electrical connection metals 270-1 and 270-2 may include a copper pillar and a solder. When the electrical connection metals 270-1 and 270-2 are formed as a single-layer structure, the electrical connection metals 270-1 and 270-2 may include a tin-silver solder or copper. However, the above materials are merely exemplary materials, and a material of the electrical connection metals 270-1 and 270-2 is not limited thereto. The number, an interval, a disposition, and the like, of the electrical connection metals 270-1 and 270-2 are not limited, and may be sufficiently modified by a person skilled in the art depending on design particulars.

At least one of the electrical connection metals 270-1 and 270-2 may be disposed in a fan-out region. The term "fan-out region" refers to a region except for a region in which the semiconductor chips 220 and 320 are disposed. For example, the semiconductor package 100A may be a fan-out semiconductor package. The fan-out package may have improved reliability as compared to a fan-in package, may allow a plurality of input/output (I/O) terminals to be implemented, and may facilitate a three-dimensional (3D) interconnection. Moreover, as compared to a ball grid array (BGA) package, a land grid array (LGA) package, or the like, the fan-out package may be manufactured to have a small thickness, and may be superior in price competitiveness.

An underbump metal 260 may improve connection reliability of the electrical connection metals 270-1 and 270-2 to improve board-level reliability of the packages 200A and 300A. The underbump metal 260 is connected to the redistribution layers 242 and 342 or the backside wiring layer 232, and/or the backside metal layer 234 through the openings of the passivation layers 250-1 and 250-2. The underbump metal 260 may be formed in the opening by a metallization method using a conductive material, for example, a metal, but a formation method thereof is not limited thereto. As necessary, the underbump metal 260 may be added or omitted. In the drawing, the underbump metal 260 is illustrated in the opening of the second passivation layer 250-2 and is omitted in the opening of the first passivation layer 250-1.

Figure 11:
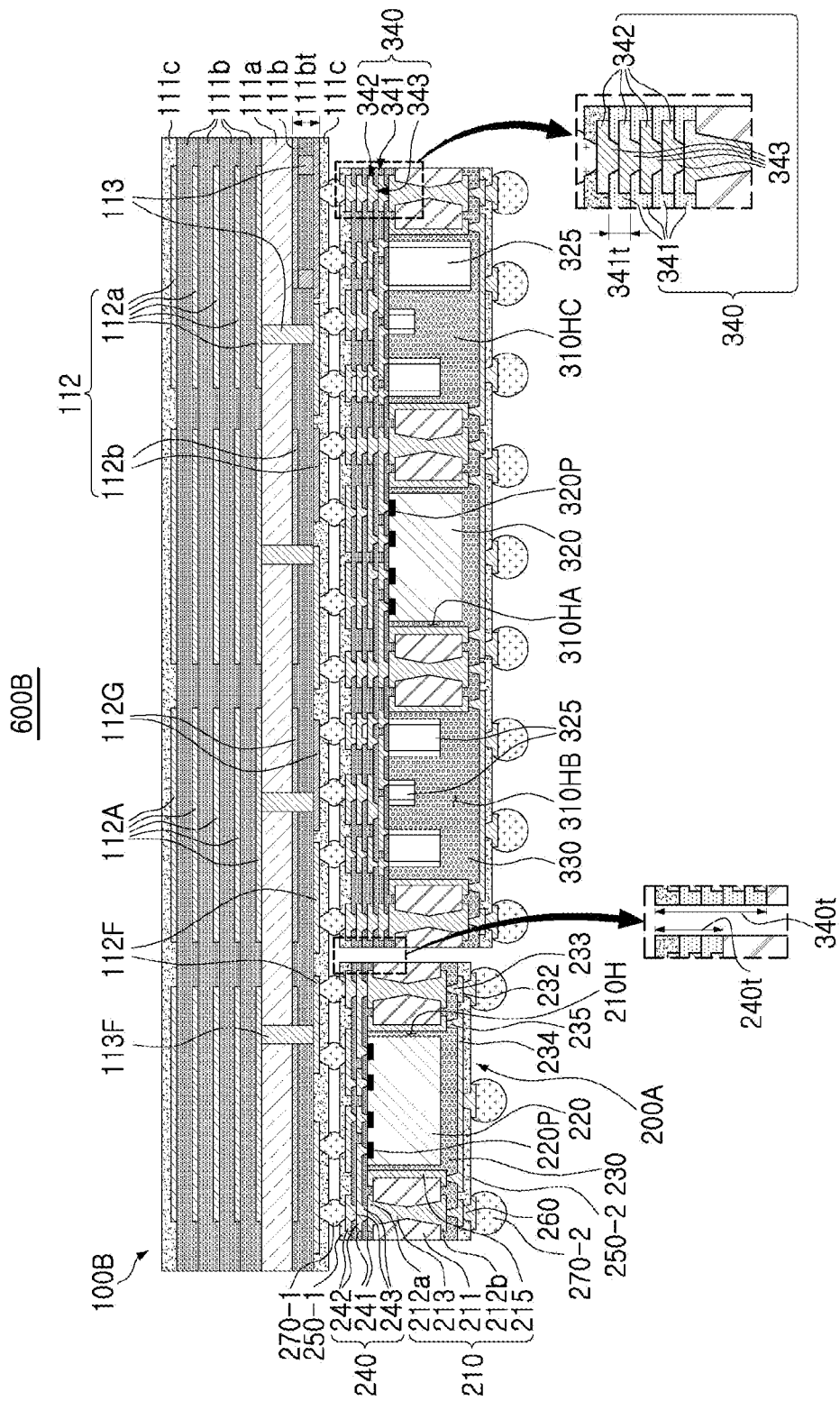
FIG. 11 is a schematic cross-sectional view illustrating another example of an antenna module.

FIG. 11 is a schematic cross-sectional view illustrating another example of an antenna module.

Referring to FIG. 11, an antenna module 600B according to another example includes an antenna substrate 100B according to another example and a second semiconductor package 300B according to another example. In the antenna substrate 100B, an upper wiring layer 112a includes a greater number of layers than a lower wiring layer 112b. A second redistribution layer 342 of the second semiconductor package 300B includes a greater number of layers than a first redistribution layer 242 of a first semiconductor package 200A. For example, a second connection member 340 except for an electrical connection metal 270-1 has a thickness 340t greater than a thickness 240t of a first connection member 240 except for the electrical connection metal 270-1. A second connection member 340 of the second semiconductor package 300B includes a second redistribution layer 342 including a greater number of layers than the lower wiring layer 112b of the antenna substrate 100B.

In this case, a single insulating layer 111b of the antenna substrate 100b, in which the lower wiring layer 112b is formed, has a thickness 111bt greater than a thickness 341t of a single insulating layer 341 of the second connection member 340 in which a second redistribution layer 342 is formed. Accordingly, an overall thickness of the antenna module 600B may be reduced by decreasing the number of layers of the lower wiring layer 112b and increasing the number of layers of the second redistribution layer 342. Since the number of layers of the lower wiring layer 112b of the antenna substrate 100B is decreased, a signal path of the first semiconductor chip 220, disposed in the first semiconductor package 200A, and the antenna pattern 112A may be shortened.

The second semiconductor package 300A may further include a plurality of passive components 325 disposed on a bottom surface of the second connection member 340, and at least some of the plurality of passive components 325 may be electrically connected to each other through the one or more second redistribution layers 342. For example, the number of layers of the second redistribution layer 342, providing a path connecting the plurality of passive components 325 embedded in the second semiconductor package 300A, may be sufficiently secured to connect the embedded passive components 325 to each other through the second redistribution layer 342 of the second connection member 340 rather than through a path passing through the lower wiring layer 112b of the antenna substrate 100B.

Descriptions of the other components are substantially the same as the detailed descriptions in the antenna module 600A, and will be omitted herein.

Figure 12:
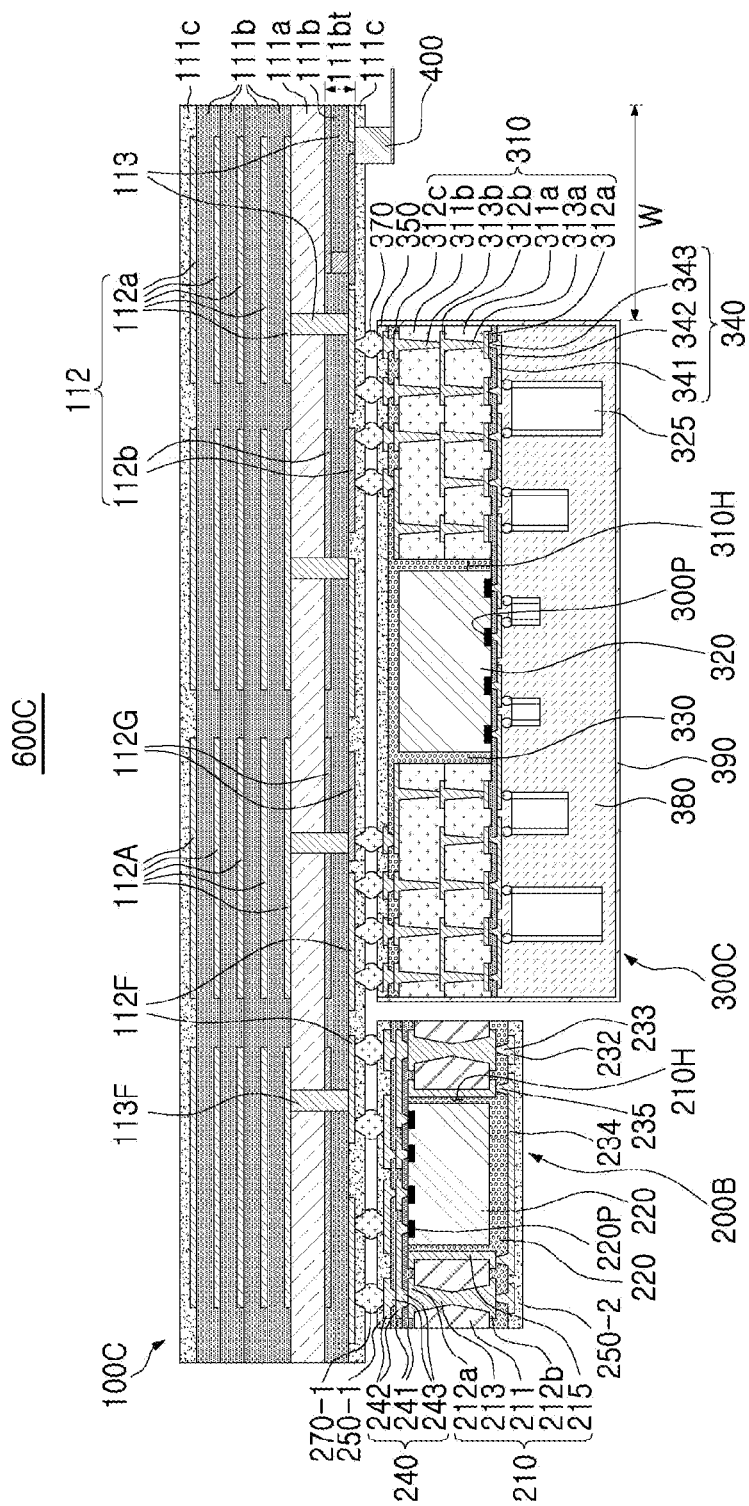
FIG. 12 is a schematic cross-sectional view illustrating another example of an antenna module.

FIG. 12 is a schematic cross-sectional view illustrating another example of an antenna module.

Referring to FIG. 12, an antenna module 600C according to another example includes an antenna substrate 100C according to another example and first and second packages 200B and 300C according to another example.

The antenna substrate 100C may further include a connector 400 which may be electrically connected to an external component. The connector 400 may be connected to a coaxial cable, a flexible printed circuit board (FPCB), or the like, when the antenna module 600C is disposed in a set, to provide a physical and/or electrical connection path to the other components in the set. Accordingly, a first semiconductor package 200B and a second semiconductor package 300C according to another example may not include an electrical connection metal therebelow. A material or a shape of the connector 410 is not limited, and all known materials or shapes may be used.

The second semiconductor package 300C includes a frame 310 having a through-hole 310H and including one or more wiring layers 312 and one or more connection vias 313 electrically connecting the one or more wiring layers 312, the second semiconductor chip 320, disposed in the through-hole 310H, having a first surface, on which a connection pad is disposed, and a second surface opposing the first surface, an encapsulant 330 encapsulating at least portions of the frame 310 and the second semiconductor chip 320, a second connection member 340, disposed on the frame 310 and the first surface of the second semiconductor chip 320, having a first side, facing the frame 310, and a second side, opposing the first side, and including the one or more second redistribution layers 342 electrically connected to the connection pad and the one or more wiring layers 312, one or more first passive component 325 disposed on the second side of the second connection member 340 and electrically connected to the one or more second redistribution layers 342, a molding material 380, disposed on the second side of the second connection member 340, covering at least a portion of each of the one or more first passive components 325, and a metal layer 390 covering at least a portion of an external surface of each of the frame 310, the second connection member 340, and the molding material 380.

In the second semiconductor package 300C, the second semiconductor chip 320 and the passive component 325 are vertically disposed on the first side and second side of the second connection member 340, respectively, to reduce left and right spaces occupied by the second semiconductor package 300C. Thus, an extra area W of the antenna substrate 100C may be secured to further improve a degree of freedom in design of an antenna.

The frame 310 may further improve rigidity of the package 300C depending on detailed materials and may serve to secure thickness uniformity of the encapsulant 330. The frame 310 has at least one through-hole 310H. The through-hole 310H may penetrate through the frame 310, and the second semiconductor chip 320 may be disposed in the through-hole 310H. The second semiconductor chip 320 is disposed to be spaced apart from a wall surface of the through-hole 310H by a predetermined distance and may be surrounded by the wall surface of the through-hole 310H. However, such a form is only an example and may be variously modified to have other forms, and the frame 310 may perform another function depending on such a form.

The frame 310 includes a great number of wiring layers 312a, 312b, and 312c, allowing the second connection member 340 to be further simplified. Accordingly, a yield decrease, caused by a defect occurring during formation of the second connection member 340, may be prevented. For example, the frame 310 includes a first insulating layer 311a disposed in contact with the second connection member 340, a first wiring layer 312a disposed in contact with the second connection member 340 and embedded in the first insulating layer 311a, a second wiring layer 312b disposed on a bottom surface of the first insulating layer 311a, a side opposing a side in which the first wiring layer 312a is embedded, a second insulating layer 311b, disposed on the bottom surface of the first insulating layer 311a, covering the second wiring layer 312b, a third wiring layer 312c disposed on a bottom surface of the second insulating layer 312b, a first connection via 313a penetrating through the first insulating layer 311a and connecting the first and second wiring layers 312a and 312b to each other, and a second connection via 313b penetrating through the second insulating layer 311b and connecting the second and third wiring layers 312b and 312c to each other. Since the first wiring layer 312a is buried, an insulation distance of the insulating layer 341 of the connection member 340 may be substantially constant.

A material of the insulating layers 311a and 311b is not limited. For example, a material of the insulating layers 311a and 311b may be a thermosetting resin such as an epoxy resin, a thermoplastic resin such as a polyimide resin, or a resin including a reinforcing material such as an inorganic filler, for example, silica, alumina, or the like, more specifically, Ajinomoto Buildup Film (ABF), FR-4, Bismaleimide Triazine (BT), a photoimagable dielectric (PID) resin, or the like. Alternatively, a material of the insulating layers 311a and 311b may be a material in which a thermosetting resin or a thermoplastic resin is impregnated together with an inorganic filler in a core material such as a glass fiber (or a glass cloth or a glass fabric), for example, prepreg, or the like. In this case, improved rigidity of the frame 310 may be maintained, and the frame 310 may be used as a type of support member. The first insulating layer 311a and a second insulating layer 311b may include the same insulating material, and a boundary therebetween may be apparent but is not limited thereto.

A surface treatment layer, not illustrated, may be further formed on a certain wiring layer 312c, exposed through an opening formed in the encapsulant 330, among the wiring layers 312a, 312b, and 312c. The surface treatment layer, not illustrated, is not limited, as long as it is known in the art, and may be formed by, for example, electrolytic gold plating, electroless gold plating, organic solderability preservative (OSP) or electroless tinplating, electroless silver plating, electroless nickel plating/substituted gold plating, direct immersion gold (DIG) plating, hot air solder leveling (HASL), or the like. Each of the wiring layers 312a, 312b, and 312c of the frame 310 may have a thickness greater than a thickness of the redistribution layer 342 of the connection member 340. This is because the frame 310 may have the same level of thickness as the semiconductor chip 320 while the connection member 340 is required to be thinned, and processes are different from each other.

The connection vias 313a and 313b electrically connect the wiring layers 312a, 312b, and 312c, disposed on different layers, to each other. As a result, an electrical path is formed in the frame 310. The connection vias 313a and 313b may also be formed of a conductive material. The connection via 313 may be filled with a conductive material. Alternatively, a conductive material is formed along a wall surface of a via hole. In addition, the connection via 313 may have a tapered shape as well as all known shapes such as a cylindrical shape and the like.

Some pads of the first wiring layer 312a may serve as a stopper when a hole for the first connection via 313a is formed, and some pads of the second redistribution layer 312 may serve as a stopper when a hole for the second connection via 313b is formed. Accordingly, it is advantageous in process that each of the first and second connection vias 313a and 313b has a tapered shape in which an upper surface has a width greater than a width of a lower surface. In this case, the first connection via 313b may be integrated with a portion of the second wiring layer 312b, and the second connection via 313b may be integrated with a portion of the third wiring layer 312c.

The encapsulant 330 fills at least a portion of the through-hole 310H and encapsulates the semiconductor chip 320. An encapsulation form of the encapsulant 330 is not limited as long as at least a portion of the semiconductor chip 320 is covered with the encapsulant 330. For example, the encapsulant 330 may cover the frame 310 and at least a portion of an inactive surface of the semiconductor chip 320, and may fill at least a portion of a space between a wall surface of the through-hole 310H and a side surface of the semiconductor chip 320.

The encapsulant 330 may fill the through-hole 310H to serve as an adhesive for fixing the semiconductor chip 320 depending on a detailed material and to reduce buckling. The encapsulant 330 includes an insulating material. The insulating material may be a thermosetting resin such as an epoxy resin, a thermoplastic resin such as a polyimide resin, or a resin including a reinforcing material such as an inorganic filler, or the like, more specifically, ABF, FR-4, BT. Alternatively the insulating material an epoxy molding component (EMC), a photoimagable encapsulant (PIE), or the like. As necessary, the insulating material may be a material in which a thermosetting resin or a thermoplastic resin is impregnated with an inorganic filler and/or a glass fiber.

The passive component 325 may be mounted on the second connection member 340 through a low melting point metal to be electrically connected to the redistribution layer 342. The low melting point metal refers to a metal, such as tin (Sn), having a lower melting point than copper (Cu) and may be, for example, a solder bump or the like. At least one of the passive components 325 may be disposed in a region within the active surface of the second semiconductor chip 320 when viewed in a direction of the active surface of the second semiconductor chip 320. For example, the passive component 325 may be mounted in most region of an upper portion of the second connection member 340. In addition, the passive component 325 may be directly mounted on the second connection member 340. Accordingly, when a plurality of passive components 325 are mounted, a distance therebetween may be significantly reduced to improve mounting density. An underfill resin, not illustrated, may be disposed between the second connection member 340 and the molding material 380 to bond the second connection member 340 and the molding material 380. The passive component 325 may be more effectively mounted on and fixed to the connection member 340 by embedding the low melting point metal connecting the passive component 325 to the second redistribution layer 342.

The passive components 325 may have different sizes and thicknesses, and may have a thickness different from a second semiconductor chip 320. For example, the passive components 325 may include a first passive component and a second passive component having a thickness smaller than a thickness of the first passive component. The first passive component may be disposed on an outer side of the second passive component, and at least a portion of the second passive component, having a relatively smaller thickness, may be disposed on a location in which the at least a portion of the second passive component overlaps the semiconductor chip in a vertical direction. The number of the passive components 325 is not limited, and may be is greater or smaller than the number of components illustrated in the drawing.

The molding material 380 may encapsulate at least portions of top surfaces of the passive component 325 and the connection member 340. An encapsulation form of the molding material 380 is not limited as long as the molding material 380 covers at least a portion of the passive component 325 on the connection member 340. The molding material 380 may cover at least portions of a top surface, a bottom surface, and a side surface of the passive component 325. The molding material 380 may extend onto the second connection member 340 to be in contact with a top surface of the second redistribution layer 342. The molding material 380 may include the same or different material as or from the encapsulant 330. For example, the encapsulant 330 may be ABF and the molding material may be EMC, and vice versa.

The metal layer 390 covers a top surface and a side surface of the molding material 380, and extends to side surfaces of the connection member 340 and the frame 310. The metal layer 390 may be connected to the redistribution layer 342 in a region, not illustrated, to receive a ground signal from the connection member 340, but is not limited thereto. An EMI shielding function of the package 300 may be further improved by the metal layer 390. The metal layer 390 may include a metal material such as copper (Cu), aluminum (Al), silver (Ag), tin (Sn), nickel (Ni), lead (Pb), titanium (Ti), or alloys thereof. In addition, different types of metal materials may constitute a multilayer structure including two or more layers.

A backside wiring layer may be provided on the encapsulant 330 to be electrically connected to the wiring layer 312 of the frame 310. A passivation layer 350, having an opening exposing at least a portion of the backside wiring layer, and an electrical connection metal 370, disposed in the opening of the passivation layer 350, are provided.

Descriptions of the other components are substantially the same as the detailed descriptions in the antenna module 600A, and will be omitted herein.

Figure 13:
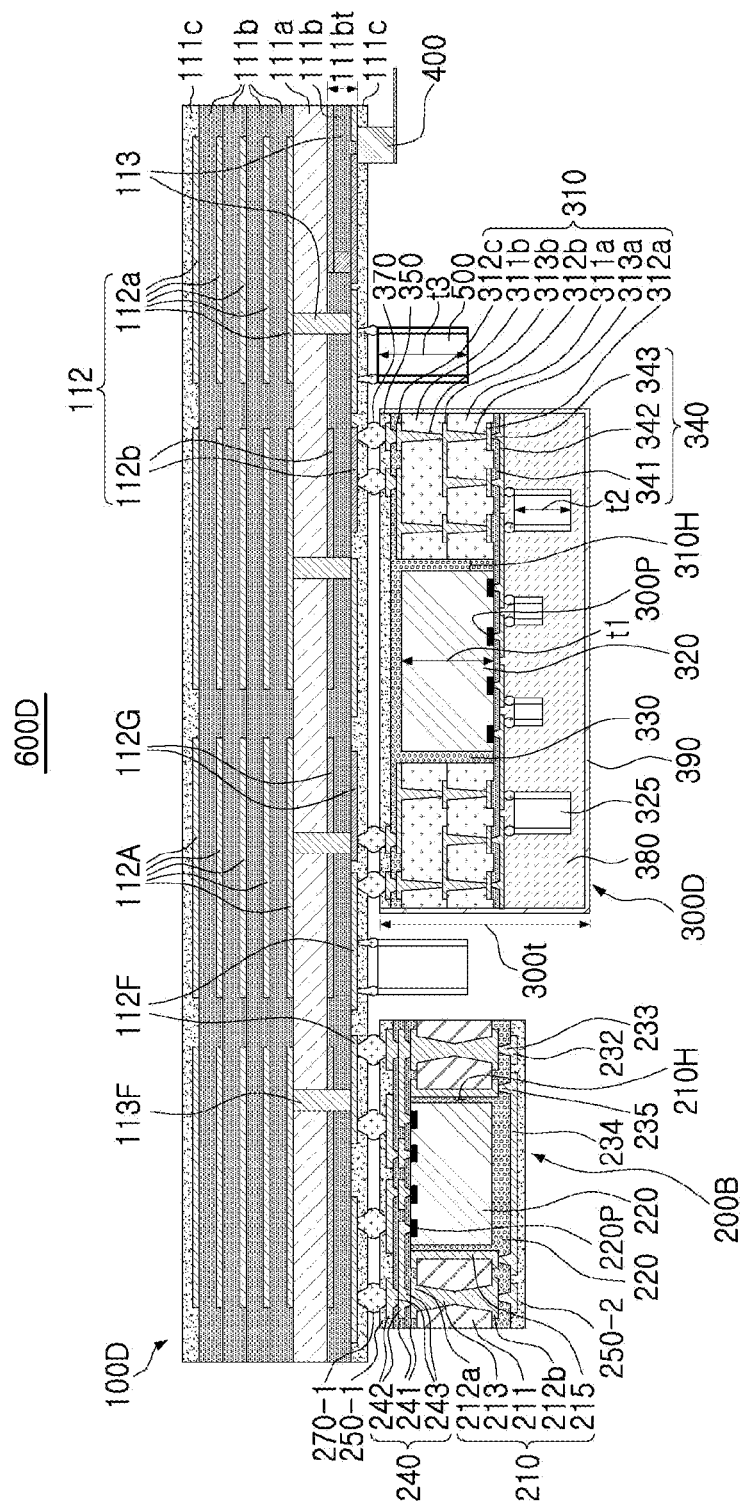
FIG. 13 is a schematic cross-sectional view illustrating another example of an antenna module.

FIG. 13 is a schematic cross-sectional view illustrating another example of an antenna module.

Referring to FIG. 13, an antenna module 600D according to another example includes an antenna substrate 100D according to another example and a second semiconductor package 300D according to another example.

The antenna substrate 100D further includes a second passive component 500 disposed on a bottom surface of the antenna substrate 100D to be spaced apart from the first semiconductor package 200B and the second semiconductor package 300D, and electrically connected to a lower wiring layer 112b of the antenna substrate 100D. The second passive component 500 may have a thickness t3 greater than a thickness t2 of the first passive component 325, embedded in the second semiconductor package 300D, and greater than or equal to a thickness t1 of the second semiconductor chip 320. For example, the second passive component 500 may be a passive component, such as a capacitor, an inductor, or the like, having the thickness t3 greater than the thickness t1 of the second semiconductor chip 320 and the thickness t2 of the first passive component 325.

For example, the second passive component 500 may be a power inductor (PI) required to have a great thickness in order to have high capacitance. The second passive component 500 may be electrically connected to the second semiconductor chip 320 of the second semiconductor and/or the passive component 325 through the lower wiring layer 112b of the antenna substrate 100D. The second passive component 500 may be mounted using a solder adhesive or the like, but mounting of the second passive component 500 is not limited thereto.

Accordingly, the first passive component 325, embedded in the second semiconductor package 300D, includes a plurality of passive components, each having a thickness t2 smaller than the thickness t3 of the second passive component 500 directly mounted on the antenna substrate 100D.

Descriptions of the other components are substantially the same as the detailed descriptions in the antenna module 600A, and will be omitted herein.

Figure 14:
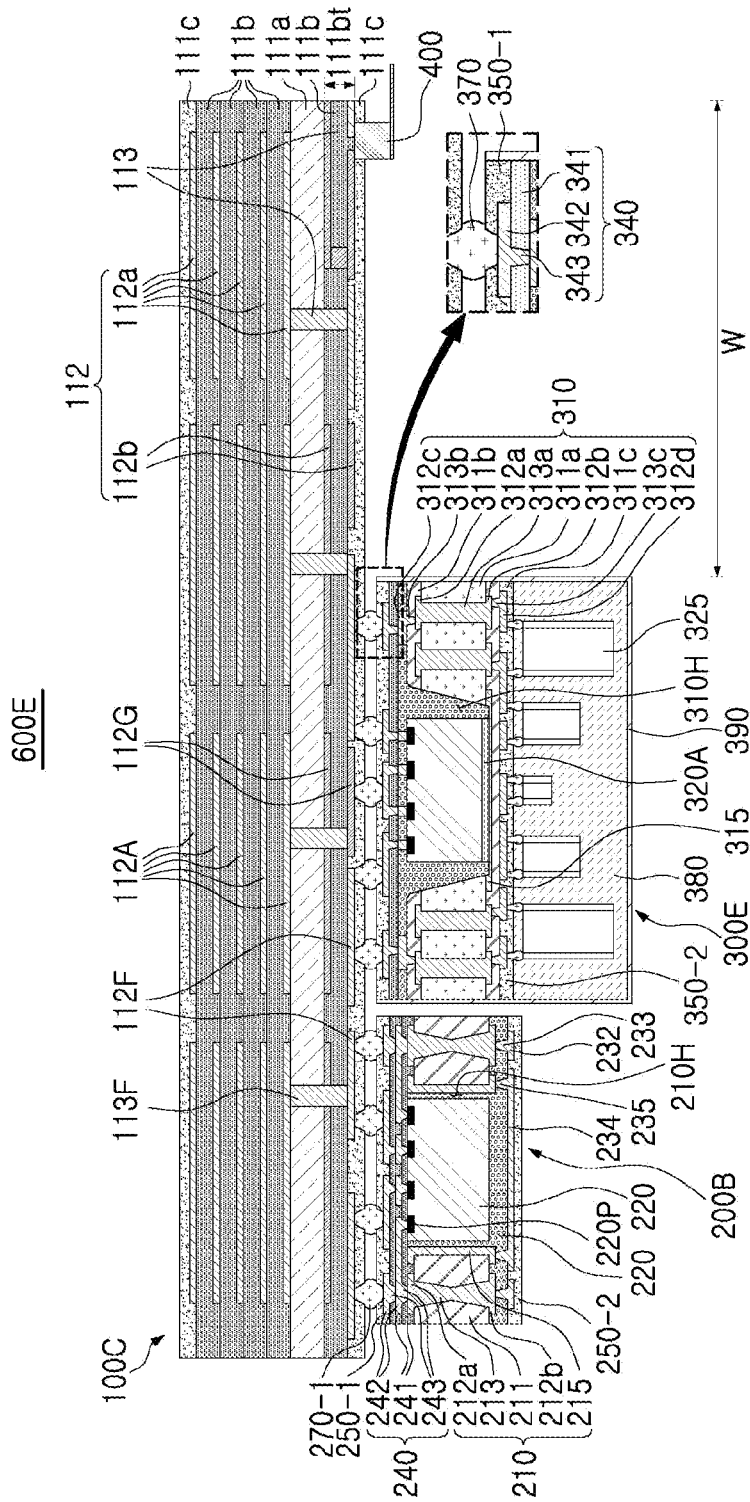
FIG. 14 is a schematic cross-sectional view illustrating another example of an antenna module.

FIG. 14 is a schematic cross-sectional view illustrating another example of an antenna module.

Referring to FIG. 14, an antenna module 600E according to another example includes a second semiconductor package 300E according to another example.

The second semiconductor package 300E includes a frame 310 including one or more insulating layers 311a, 311b, and 311c, provided with a cavity 310H having one side covered with a metal plate 315, one or more wiring layers 312a, 312b, 312c, and 312d, respectively disposed on the insulating layers 311a, 311b, and 311c, and one or more connection vias 313a, 313b, and 313c penetrating through the insulating layers 311a, 311b, and 311c and electrically connecting the one or more wiring layers 312a, 312b, 213c, and 312d, a second semiconductor chip, having a first surface, on which a connection pad is disposed, and a second surface opposing the first surface, disposed in the cavity 310H in such a manner that the second surface faces the metal plate 315, an encapsulant covering at least a portion of each of the frame 310 and the second semiconductor chip, the second connection member 340, disposed on the frame 310 and the first surface of the second semiconductor chip, including the one or more second redistribution layers 342, having a first side, facing the frame 310, and a second side, opposing the first side, electrically connected to the connection pad and the wiring, one or more first passive components 325 disposed on the frame 310 and the second surface of the second semiconductor chip and electrically connected to one or more wiring layers of the frame 310, a molding material 380, disposed on the frame 310 and the second surface of the second semiconductor chip, covering at least a portion of each of the first passive components 325, and a metal layer 390 covering at least a portion of an external surface of each of the frame 310, the second connection member 340, and the molding material 380.

In the second semiconductor package 300E, the number of layers of the second redistribution layer 342 may be decreased using the multiple wiring layers 312 to reduce manufacturing costs and to improve process efficiency. For example, the second redistribution layer 342 may be formed to include a smaller number of layers than the wiring layers 312a, 312b, 312c, and 312d of the frame 310.

The second semiconductor chip and the passive component 325 may be vertically disposed to reduce left and right spaces occupied by the second semiconductor package 300E. Thus, an extra area W of the antenna substrate 100C may be secured to further improve a degree of freedom in design of an antenna.

The frame includes the insulating layers 311a, 311b, and 311c, the wiring layers 3123a, 312b, 312c, and 312d, and the connection vias 313a, 313b, and 313c, and includes the wiring layers 312c and 312d disposed on an inactive surface of the second semiconductor chip 320. Accordingly, a backside wiring layer for the second semiconductor chip 320 may be provided without an additional process of forming a backside wiring layer.

The frame 310 has a blind-shaped cavity 310H in which the metal plate 315 is formed as a stopper, and the second semiconductor chip 320 has a second surface attached to the metal plate 315 via a known adhesive member 320A such as a die attach film (DAF) or the like. The cavity 310H may be formed using a sandblasting process. In this case, a cross-sectional shape of the cavity 310H may be a tapered shape. For example, a wall surface of the cavity 310H may have a predetermined slope with respect to the metal plate 315. In this case, an alignment process of the second semiconductor chip 320 may be further easily performed to improve yield.

The first insulating layer 311a may have a thickness greater than the second insulating layer 311b and the third insulating layer 311c. The first insulating layer 311a may have a relatively great thickness to maintain rigidity, and the second insulating layer 311b and the third insulating layer 311c may be introduced to form a greater number of wiring layers 312c and 312d. The first insulating layer 311a may include an insulating material different from an insulating material of the second insulating layer 311b and the third insulating layer 311c. For example, the first insulating layer 311a may include an insulating material in which an insulating resin is impregnated together with an inorganic filler in a glass fiber, for example, prepreg, and the second and third insulating layers 311b and 311c may include an ABF film or a PID film including an inorganic filler and an insulating resin. However, insulating materials of the first, second, and third insulating layers 311a, 311b, and 311c are not limited thereto. Under a similar viewpoint, the first connection via 313a, penetrating through the first insulating layer 311a, may have a diameter greater than a diameter of each of the second and third connection vias 313b and 313c.

The second semiconductor chip 320 may include a bump disposed on a connection pad and connected to the connection pad. The bump may include a metal material, such as copper (Cu) or the like, or a solder material. A surface of the frame 310, facing a redistribution layer 342 of a fourth redistribution layer 312d, may be disposed at the same level as a surface of the second semiconductor chip 320 facing a redistribution layer 342 of the bump. Accordingly, a redistribution via 343, connecting the bump to the redistribution layer 342, may have the same height as a redistribution via 343 connecting the fourth wiring layer 312d to the redistribution layer 342. The expression "same height" refers to a concept including a fine difference depending on a processor error. As described above, when a surface, on which the second connection member 340 is formed, is planarized by a grinding process, the insulating layer 341 is planarized. Therefore, the redistribution layer 342 or the redistribution via 343 may be further finely formed.

A first passivation layer 350-1, having an opening exposing at least a portion of the second redistribution layer 342, and a second passivation layer 350-2, having an opening exposing at least a portion of the wiring layer 312d of the frame 310 disposed in direct contact with the first passive component 325, may be omitted, as necessary.

Although not illustrated in the drawing, a metal thin film may be formed on a wall surface of the cavity 110H to achieve heat radiation and/or EMI shielding, as necessary. In addition, a plurality of semiconductor chips, performing the same function or different functions to each other, may be disposed in the cavity 310H, as necessary. In addition, among the first passive components 325, some passive components, having different heights to each other, may be disposed outside of the second semiconductor package, as necessary.

Descriptions of the other components are substantially the same as the detailed descriptions in the antenna module 600A, and will be omitted herein.

Figure 15:
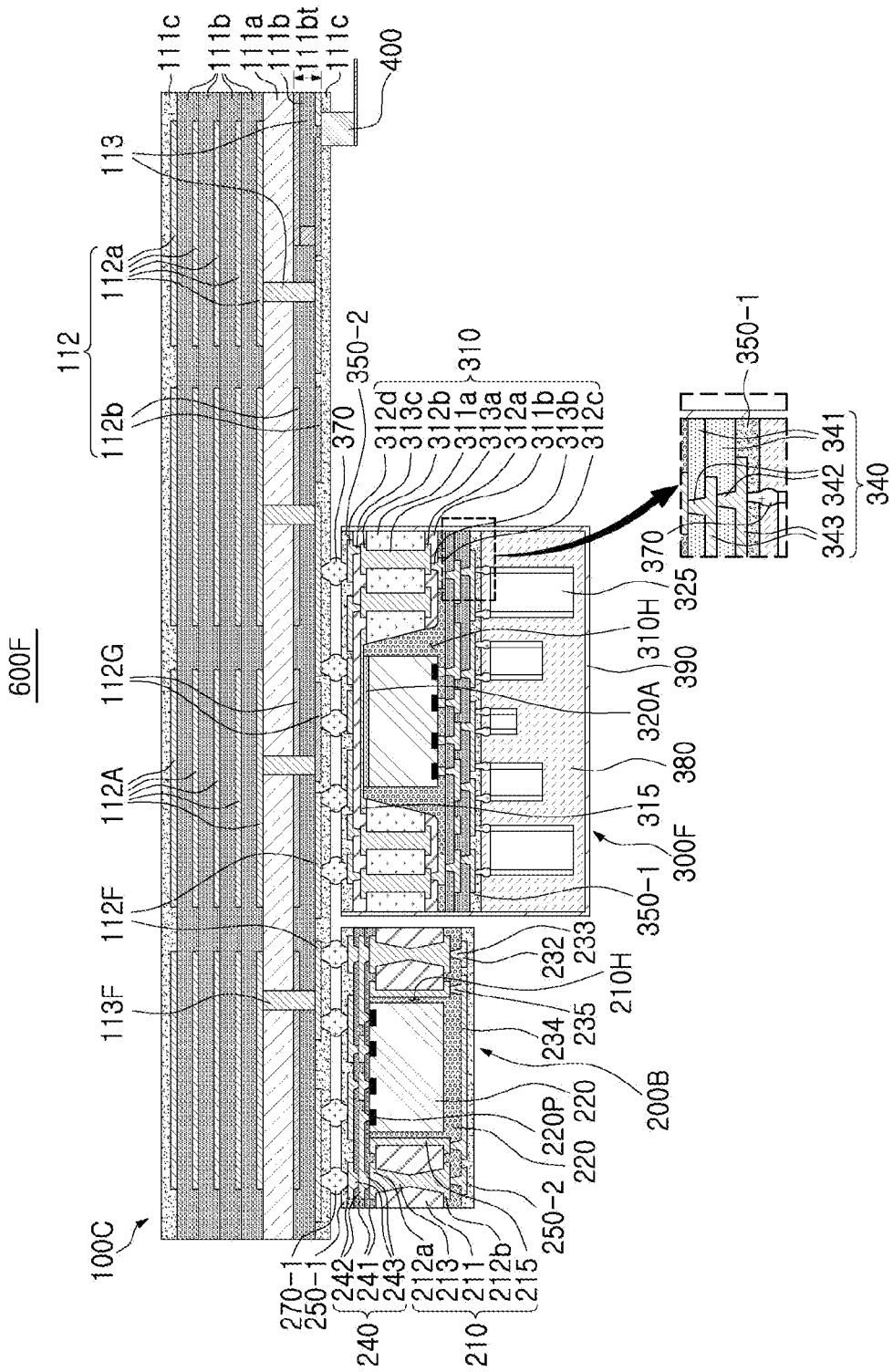
FIG. 15 is a schematic cross-sectional view illustrating another example of an antenna module.

FIG. 15 is a schematic cross-sectional view illustrating another example of an antenna module.

Referring to FIG. 15, an antenna module 600F according to another example includes a second semiconductor package 300F according to another example. Unlike the above-described second semiconductor package 300E, the second semiconductor package 300F further includes one or more first passive components 325, disposed on a second side of a second connection member and electrically connected to one or more second redistribution layers 342, and a molding material 380, disposed on the second side of the second connection member 340, covering at least a portion of each of the first passive components 325. The metal layer 390 covers at least a portion of an external surface of each of the frame 310, the second connection member 340, and the molding material 380.

As described above, an antenna module, in which a signal path between an antenna and a semiconductor chip is shortened and a degree of freedom in a shape of the antenna is high, may be provided.

In the present disclosure, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to a direction opposite to the direction toward a mounting surface. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another exemplary embodiment. However, example embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an example embodiment rather than limiting the present disclosure. In this case, singular forms include plural forms unless interpreted otherwise in context.

While example embodiments have been shown and described above, it will be apparent to those skilled in the art that modifications and variations could be made without departing from the scope of the present disclosure as defined by the appended claims.

What is claimed is:

1. An antenna module comprising:
an antenna substrate including a core layer, one or more upper wiring layers disposed on a top surface of the core layer, and one or more lower wiring layers disposed on a bottom surface of the core layer;
a first semiconductor package, disposed on the antenna substrate, including a first connection member including one or more first redistribution layers, electrically connected to the antenna substrate, and a first semiconductor chip disposed on the first connection member; and
a second semiconductor package, disposed on the antenna substrate and spaced apart from the first semiconductor package, including a second connection member including one or more second redistribution layers, electrically connected to the antenna substrate, and a second semiconductor chip disposed on the second connection member,
wherein the first semiconductor chip and the second semiconductor chip are different types of semiconductor chips, and
wherein the second connection member of the second semiconductor package includes the second redistribution layer having a greater number of layers than the one or more first redistribution layers of the first connection member of the first semiconductor package.

2. The antenna module of claim 1, wherein the first semiconductor chip and the second semiconductor chip are electrically connected to each other through the lower wiring layer.

3. The antenna module of claim 1, further comprising:
one or more passive components disposed on the second connection member and disposed parallel to the second semiconductor chip,
wherein at least a portion of the one or more of passive components are electrically connected to each other through the one or more second redistribution layers.

4. The antenna module of claim 1, wherein the first semiconductor chip includes a radio-frequency integrated circuit (RFIC).

5. The antenna module of claim 1, wherein the second semiconductor chip includes a power management integrated circuit (PMIC).

6. The antenna module of claim 1, wherein the second semiconductor package comprises:
a frame having a through-hole and including one or more wiring layers and one or more connection vias electrically connecting the one or more wiring layers to each other;
the second semiconductor chip, disposed in the through-hole, having a first surface, on which a connection pad is disposed, and a second surface opposing the first surface;
an encapsulant encapsulating at least portions of the frame and the second semiconductor chip;
the second connection member, disposed on the frame and the first surface of the second semiconductor chip, having a first side, facing the frame, and a second side, opposing the first side, and including the one or more second redistribution layers electrically connected to the connection pad and the one or more wiring layers;
one or more first passive components disposed on the second side of the second connection member and electrically connected to the one or more second redistribution layers;
a molding material, disposed on the second side of the second connection member, covering at least a portion of each of the one or more first passive components; and
a metal layer covering at least a portion of an external surface of each of the frame, the second connection member, and the molding material.

7. The antenna module of claim 6, further comprising:
a second passive component disposed on the antenna substrate, spaced apart from the first semiconductor package and the second semiconductor package, and electrically connected to the lower wiring layer of the antenna substrate,
wherein the second passive component has a thickness greater than a thickness of each of the one or more first passive components.

8. The antenna module of claim 7, wherein the second passive component is a power inductor (PI).

9. The antenna module of claim 6, further comprising:
a connector disposed on one side of the antenna substrate and electrically connected to the antenna substrate.

10. The antenna module of claim 1, wherein the second semiconductor package comprises:
a frame including one or more insulating layers, one or more wiring layers, respectively disposed on the one or more insulating layers, and one or more connection vias respectively penetrating through the one or more insulating layers and electrically connecting the one or more wiring layers, the frame having a cavity having one surface covered with a metal plate;
the second semiconductor chip, having a first surface, on which a connection pad is disposed, and a second surface opposing the first surface, disposed in the cavity such that the second surface faces the metal plate;
an encapsulant covering at least a portion of each of the frame and the second semiconductor chip;
the second connection member, disposed on the frame and the first surface of the second semiconductor chip, including the one or more second redistribution layers, having a first side, facing the frame and a second side, opposing the first side, and electrically connected to the connection pad and the one or more wiring layers;
one or more first passive components disposed on the frame and the second surface of the second semiconductor chip and electrically connected to one or more wiring layers of the frame;
a molding material, disposed on the frame and the second surface of the second semiconductor chip, covering at least a portion of each of the one or more first passive components; and a metal layer covering at least a portion of an external surface of each of the frame, the second connection member, and the molding material.

11. The antenna module of claim 1, wherein the second semiconductor package comprises:

a frame including one or more insulating layers, one or more wiring layers, respectively disposed on the one or more insulating layers, and one or more connection vias respectively penetrating through the one or more insulating layers and electrically connecting the one or more wiring layers, the frame including a cavity having one surface covered with a metal plate;

the second semiconductor chip, having a first surface on which a connection pad is disposed and a second surface opposing the first surface, disposed in the cavity such that the second surface faces the metal plate;

an encapsulant covering at least a portion of each of the frame and the second semiconductor chip;

the second connection member, disposed on the frame and the first surface of the second semiconductor chip, including the one or more second redistribution layers, having a first side facing the frame, and a second side opposing the first side, electrically connected to the connection pad and the one or more wiring layers;

one or more passive component disposed on the second side of the second connection member and electrically connected to the one or more second redistribution layers;

a molding member, disposed on the second side of the second connection member, covering at least a portion of each of the one or more passive components; and a metal layer covering at least a portion of an external surface of each of the frame, the second connection member, and the molding material.

12. The antenna module of claim 11, further comprising:
a connector disposed on one side of the antenna substrate and electrically connected to the antenna substrate.

13. The antenna module of claim 1, further comprising:
a plurality of electrical connection metals respectively disposed on bottom surfaces of the first semiconductor package and the second semiconductor package, and respectively electrically connected to the one or more first redistribution layers and the one or more second redistribution layers.

14. An antenna module comprising:

an antenna substrate including a core layer, one or more upper wiring layers disposed on a top surface of the core layer, and one or more lower wiring layers disposed on a bottom surface of the core layer;

a first semiconductor package, disposed on the antenna substrate, including a first connection member including one or more first redistribution layers, electrically connected to the antenna substrate, and a first semiconductor chip disposed on the first connection member; and a second semiconductor package, disposed on the antenna substrate and spaced apart from the first semiconductor package, including a second connection member including one or more second redistribution layers, electrically connected to the antenna substrate, and a second semiconductor chip disposed on the second connection member, wherein the first semiconductor chip and the second semiconductor chip are different types of semiconductor chips, and wherein the second connection member of the second semiconductor package includes the second redistribution layer having a greater number of layers than the one or more lower wiring layers of the antenna substrate.

* * * * *